(12) United States Patent
Choi et al.

(10) Patent No.: US 8,343,798 B2
(45) Date of Patent: Jan. 1, 2013

(54) METHOD FABRICATING PHASE-CHANGE SEMICONDUCTOR MEMORY DEVICE

(75) Inventors: Byoung-Deog Choi, Suwon-si (KR); Byoung-Jae Bae, Hwaseong-si (KR); Jeong-Hee Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/084,654

(22) Filed: Apr. 12, 2011

(65) Prior Publication Data

US 2011/0300684 A1    Dec. 8, 2011

(30) Foreign Application Priority Data

Jun. 7, 2010  (KR) .................. 10-2010-0053397

(51) Int. Cl.
*H01L 21/06* (2006.01)

(52) U.S. Cl. ................... 438/102; 438/99; 257/E21.645

(58) Field of Classification Search ........... 257/E21.613, 257/E21.615
See application file for complete search history.

(56) References Cited

U.S. PATENT DOCUMENTS

| | | | |
|---|---|---|---|
| 2007/0246439 A1* | 10/2007 | Lee et al. | 216/37 |
| 2008/0224116 A1* | 9/2008 | Peters | 257/3 |
| 2009/0184306 A1 | 7/2009 | Mathew et al. | |

FOREIGN PATENT DOCUMENTS

| | | |
|---|---|---|
| JP | 2004146500 A | 5/2004 |
| KR | 1020060017409 A | 2/2006 |
| KR | 1020060042314 A | 5/2006 |

* cited by examiner

*Primary Examiner* — Cheung Lee
(74) *Attorney, Agent, or Firm* — Volentine & Whitt, PLLC

(57) ABSTRACT

A method of fabricating a phase change memory having a unit memory cell is described. The unit memory cell includes a phase change element connected to a corresponding vertical cell diode. The phase change element is formed from a phase change material layer formed on an interlayer dielectric layer including a via hole, and etched using a plasma formed from a plasma gas having a molecular weight of 17 or less to form a respective phase change material pattern in the via hole.

19 Claims, 14 Drawing Sheets

FIG. 1

METHOD FABRICATING PHASE-CHANGE SEMICONDUCTOR MEMORY DEVICE

CROSS-REFERENCE TO RELATED APPLICATIONS

This application claims priority from Korean Patent Application No. 10-2010-0053397 filed on Jun. 7, 2010, the matter of which is hereby incorporated by reference.

BACKGROUND OF THE INVENTION

The present inventive concept relates to methods of fabricating semiconductor devices. More particularly, the inventive concept relates to methods of fabricating nonvolatile, phase-change semiconductor memory devices.

Semiconductor memory devices may be generally categorized as volatile devices that lose stored data in the absence of applied power and nonvolatile devices that retain stored data when applied power is interrupted or discontinued. Among other types of nonvolatile memory devices, flash memory has been widely used in many commercial applications due to its high memory cell integration density and readily fabricated stacked gate structure. However, so-called phase change memory devices are now being considered as a possible replacement for flash memory in certain applications.

However, there are a number of challenges to the efficient and reliable fabrication of phase-change memory devices. For example, like other semiconductor memory types, a phase-change semiconductor memory includes a dense array of individual memory cells. Each phase-change memory cell is configured around a small portion of phase change material that has been patterned from one or more constituent material layer(s). A mold layer (or combination of mold layers) is commonly used during methods of fabricating phase-change memory devices to separately form (or pattern), on a unit memory cell basis, respective nodes of phase-change material. However, when separating phase change material patterns on a unit memory cell basis, the mold layer defining the phase change material patterns or phase change material patterns may become damaged.

SUMMARY OF THE INVENTION

The present inventive concept provides methods of fabricating semiconductor memory devices that effectively, simply and reliably separate respective phase change material pattern nodes using a damascene structure.

According to an aspect of the inventive concept, there is provided a method of fabricating a phase change semiconductor memory device, the method comprising; forming a first electrode in an insulation layer formed on a semiconductor substrate, forming a first interlayer dielectric layer on the insulation layer including the first electrode, forming a first via hole through the first interlayer dielectric layer to expose the first electrode, forming a first phase change material layer on the first interlayer dielectric layer to at least partially fill the first via hole, and etching the first phase change material layer using a plasma formed from a plasma gas having a molecular weight of 17 or less to form a first phase change material pattern in the first via hole.

According to another aspect of the inventive concept, there is provided a method of fabricating a phase change semiconductor memory device, the method comprising; forming a first mold layer on a semiconductor substrate, forming a first opening in the first mold layer, and forming a word line in the first opening, forming a second mold layer on the first mold layer, forming a second opening in the second mold layer to expose the word line, and forming a vertical cell diode in the second opening, forming a third mold layer on the second mold layer, forming a third opening in the third mold layer to expose the vertical cell diode, and forming a first electrode in the third opening, forming a first interlayer dielectric layer on the third mold including the first electrode, forming a first via hole through the first interlayer dielectric layer to expose the first electrode, forming a first phase change material layer on the first interlayer dielectric layer to at least partially fill the first via hole, and etching the first phase change material layer using a plasma formed from a plasma gas having a molecular weight of 17 or less to form a first phase change material pattern in the first via hole.

According to yet another aspect of the inventive concept, there is provided a method of fabricating a phase change semiconductor memory device, the method comprising forming a plurality of unit memory cells, each one comprising a phase change element connected to a corresponding vertical cell diode, wherein the phase change element is formed from at one phase change material layer formed on an interlayer dielectric layer including a via hole, the at least one phase change material layer being etched using a plasma formed from a plasma gas having a molecular weight of 17 or less to form a respective phase change material pattern in the via hole.

BRIEF DESCRIPTION OF THE DRAWINGS

The above and other features and advantages of the inventive concept will become apparent upon consideration of certain exemplary embodiments thereof with reference to the attached drawings in which:

FIG. 1 is a conceptual block diagram illustrating a semiconductor device fabricated according to embodiments of the inventive concept;

DETAILED DESCRIPTION

Certain embodiments of the inventive concept will now be described with reference to the accompanying drawings.

However, the inventive concept may be embodied in many different forms and should not be construed as being limited to only illustrated embodiments. Rather, these embodiments are provided so that this disclosure will be thorough and complete and will fully convey the concept of the inventive concept to those skilled in the art, and the inventive concept will only be defined by the appended claims. Throughout the written description and drawings, like reference numbers and labels are used to denote like or similar elements.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, certain embodiment of a method of fabricating phase-change semiconductor memory devices will be described with reference to FIGS. 1 through 19D.

Figure 1:
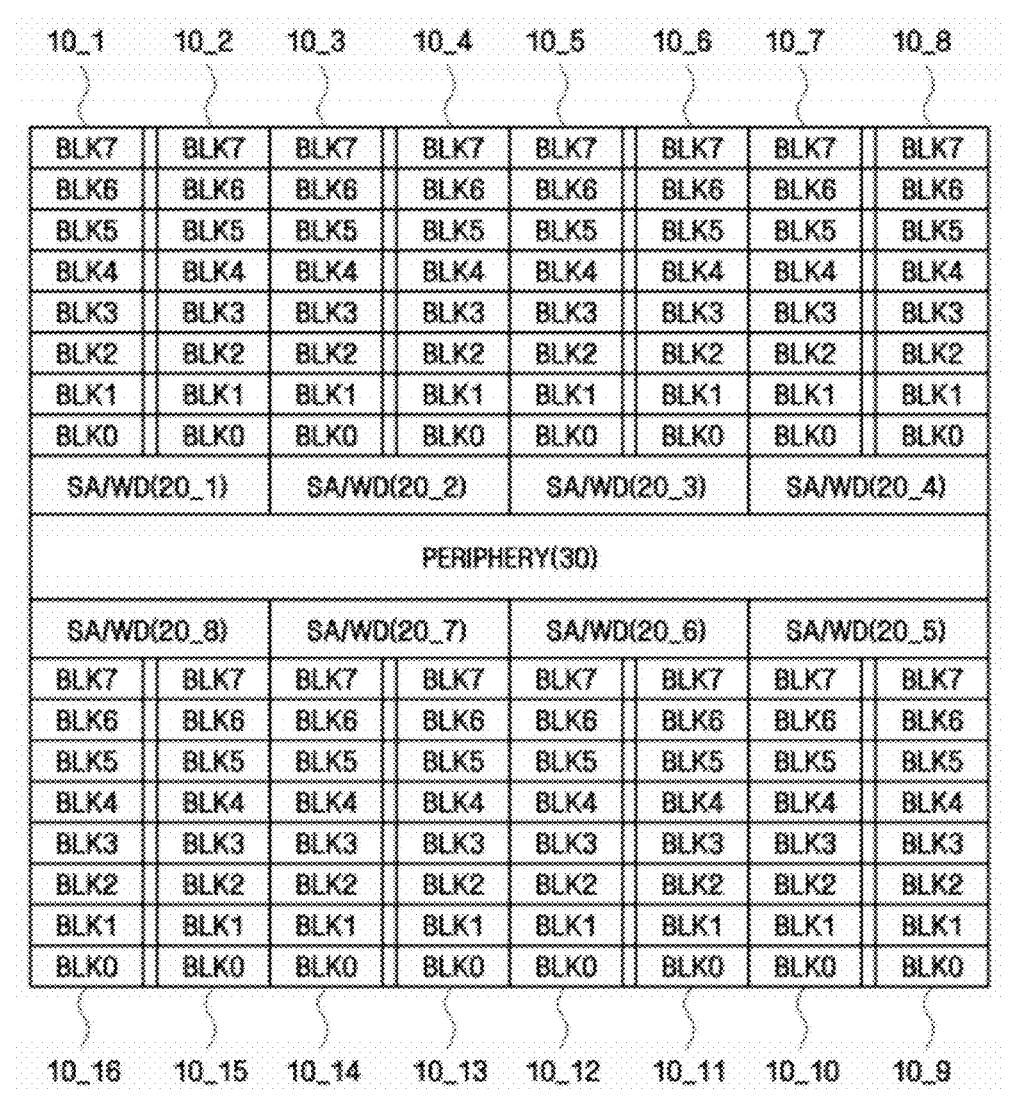
Figure 2:
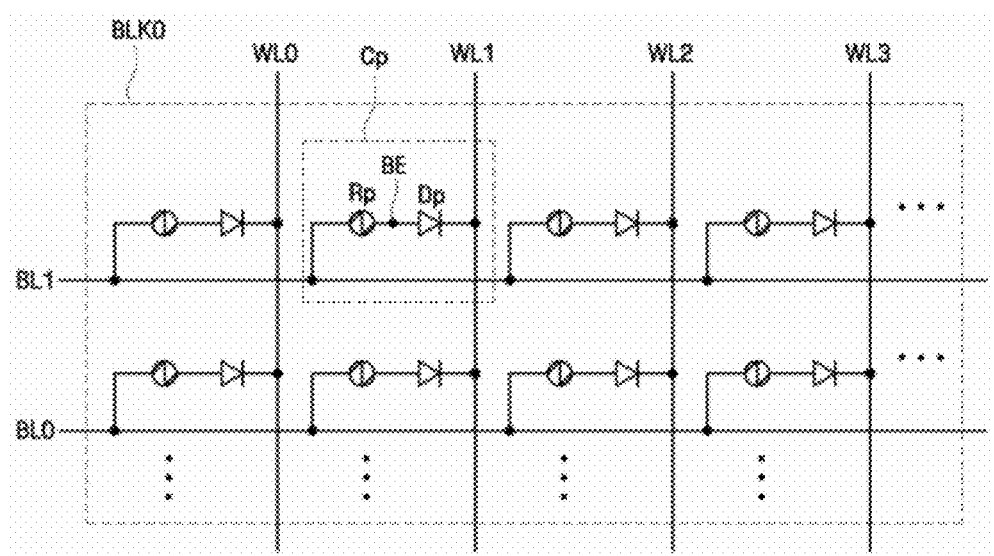
FIG. 2 is a simplified circuit diagram illustrating a portion of a memory cell array of a phase-change semiconductor device according to embodiments of the inventive concept.
Figure 3:
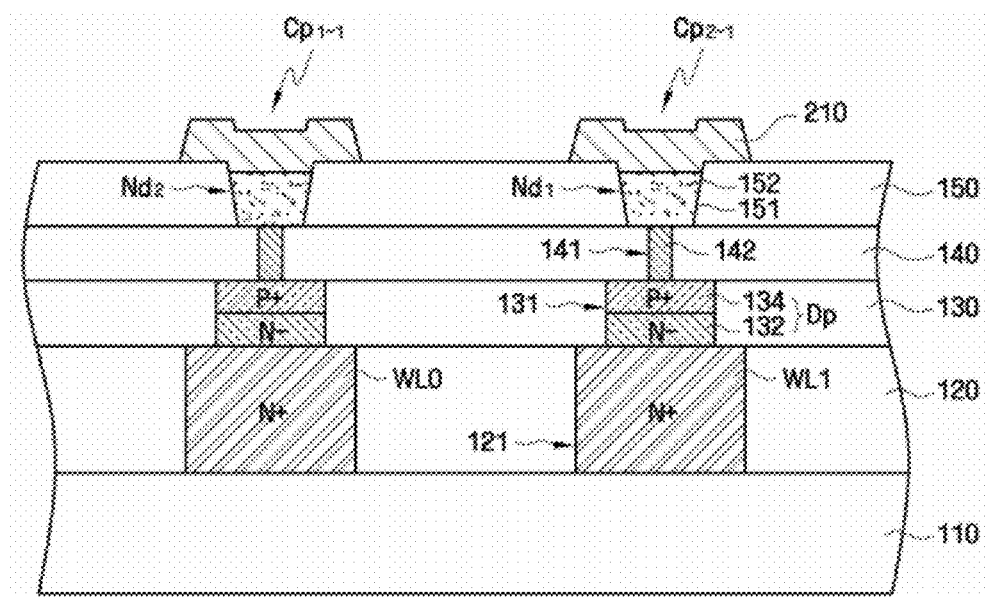
FIG. 3 is a sectional view illustrating a phase-change semiconductor device fabricated according to the embodiments of the inventive concept.

FIGS. 1, 2 and 3 variously illustrate one possible phase-change semiconductor memory device that may be fabricated according to embodiments of the inventive concept. The term "phase-change memory" will be used hereafter to describe a variety of semiconductor memory devices incorporating one or more phase-change materials within constituent memory cells. FIG. 1 is a conceptual block diagram of a phase-change memory fabricated according to embodiments of the present inventive concept. FIG. 2 is a simplified circuit diagram illustrating a portion of a memory cell array for the phase-change memory of FIG. 1. FIG. 3 is a sectional view further illustrating unit memory cells within the memory cell array of FIG. 2.

Referring to FIG. 1, the phase-change memory fabricated according to embodiments of the inventive concept may be generally configured to include multiple memory banks 10_1-10_16, multiple sense amplifiers and write drivers 20_1-20_8, and a periphery region 30 including conventionally understood periphery circuitry.

In the illustrated embodiment of FIG. 1, each of the multiple memory banks 10_1-10_16 comprises multiple memory blocks BLK0-BLK7, and each memory block 10_1-10_16 comprises multiple nonvolatile phase-change memory cells arranged in a matrix. Eight (8) memory blocks are arranged as a group in the illustrated example, but those skilled in the art will recognize this as being merely one possible arrangement among many that fall within the scope of the claimed invention.

Although not illustrated in the drawings, row decoders and column decoders corresponding to the respective memory banks 10_1-10_16 are used in conventional manner to select a row and column within the matrix of phase-change memory cells during write/read operations.

Sense amplifiers and write drivers 20_1-20_8 are disposed in relation to corresponding memory banks 10_1-10_16 and perform read/write operations. In the illustrated embodiment of FIG. 1, the sense amplifiers and write drivers 20_1-20_8 are disposed in relation to two (2) memory banks 10_1-10_16. However, other functional arrangements between these components will be readily understood by those skilled in the art. For example, the sense amplifiers and write drivers 20_1-20_8 may be arranged to correspond to one (1) memory bank or four (4) memory banks.

In the periphery region 30, a multiplicity of logic circuit blocks and voltage generators may be disposed to operate the row and column decoders, sense amplifiers, write drivers, etc.

Referring to FIG. 2, a small portion of the phase-change memory cell array forming the memory block BLK0 of FIG. 1 is further illustrated, wherein a number of unit memory cells Cp are among a plurality of bit lines BL0 and BL1 and word lines WL0-WL3.

Each memory unit cell Cp includes a phase change element Rp formed from one or more phase change materials and a corresponding vertical cell diode Dp that controls the application of electrical to the phase change element Rp. A carefully timed and regulated application of current defines a materials state for the phase-change material(s) forming the phase change element RP. Here, the phase change element Rp can be comprised of a various material such as a compound composed of two elements including GaSb, InSb, InSe, SbTe, or GeTe, a compound composed of three elements including GeSbTe, GaSeTe, InSbTe, SnSb$_2$Te$_4$, or InSbGe, or a compound composed of four elements including AgInSbTe, (GeSn)SbTe, GeSb(SeTe), or Te$_{81}$Ge$_{15}$Sb$_2$S$_2$. For example, the phase change material Rp can include GeSbTe composed of germanium (Ge), antimony (Sb), and tellurium (Te). Certain embodiments of the he phase change element Rp included in the phase-change memory unit cell Cp according to the present inventive concept will be described hereafter.

As shown in FIG. 2, the phase change element Rp may be coupled between a corresponding bit line BL0 and BL1 through the vertical cell diode Dp to a corresponding word line WL0-WL3. However, this is just one possible connection arrangement. For example, the phase change element Rp and vertical cell diode Dp may be reversed in their connection order between the bit line BL0 and BL1 and word line WL0-WL3.

One possible mode of operation for the individual memory unit cells Cp will now be described for a phase-change memory fabricated according to embodiments of the inventive concept.

During a write operation, a logical data value of "1" (or reset value) may be programmed into a memory unit cell Cp by passing an electrical current through the constituent phase change material of the phase change element Rp to heat this material above its melting temperature, and then allowing the material to rapidly cool. This heating profile places the phase change material in an amorphous material state. In the alternative, a logical data value of "0" (or set value) may be programmed into a memory unit cell Cp by passing an electrical current through the constituent phase change material of the phase change element Rp to heat this material above its crystallization temperature while remaining below its melting temperature, and then slowing cooling the material. This heating profile places the phase change material in a crystalline state. The different resistances exhibited by the amorphous verses crystalline states may subsequently be interrupted as the respective data values.

For example, approximately 1 mA of electrical current may be provided by a reset write current and approximately 0.6 to 0.7 mA of current may be provided by a set write current. A particular write current may be provided by a write circuit (not shown) through a corresponding bit line BL0 and BL1, vertical cell diode Dp, the phase change material Rp, and the word lines WL0 and WL1.

During a read operation, a read current may be passed through a programmed phase change element Rp, wherein the read current does not cause phase change of the phase change element Rp to alter its material state. Such read current may be provided by a read circuit (not shown) to flow through bit lines BL0-BL3, the vertical cell diode Dp, the phase change material Rp, and the word lines WL0 and WL1.

Referring now to FIG. 3, a method of fabricating a phase change memory according to an embodiment of the inventive concept will now be described. Two unit memory cells Cp1 and Cp2 are illustrated in FIG. 3 as examples of a great multiplicity of unit memory cells forming the memory cell array of FIG. 1. Each unit call Cp1-1 and Cp2-1 comprises a vertical cell diode Dp, a first electrode 142, a first phase change material pattern 152, and a second electrode 210.

The unit memory cells Cp1 and Cp2 are fabricated on a substrate 110 that may be a silicon substrate, a SOI (Silicon On Insulator) substrate, a GaAs substrate, or a SiGe substrate. Those skilled in the art will appreciate that certain device isolation regions (not shown) may be conventionally provided to partition certain regions of the substrate 110.

On substrate 110, a first mold layer 120 is formed. The first mold layer 120 may be formed from a silicon oxide layer SiOx, for example, FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced Tetra Ethyl Ortho Silicate), FSG (Fluoride Silicate Glass), HDP (high density plasma).

A first opening 121 is formed through the first mold layer 120. The first opening 121 is then filled with one or more conductive materials to form word lines WL0 and WL1. Here, the first opening 121 may extend to a first direction along the substrate 110 to define the word lines WL0 and WL1. The word lines WL0 and WL1 may be formed from material(s) having the same conductive type (e.g., N-type) as the semiconductor substrate 110. In certain embodiments of the inventive concept, the impurity concentration of the material(s) forming the word lines WL0 and WL1 will be greater than $1 \times 10^{19}$ atoms/cm$^3$. The conductive material(s) forming the word lines WL0 and WL1 may be epitaxially grown from the substrate. Thus, if the semiconductor substrate 110 has a single crystal composition, the word lines WL0 and WL1 will have a similar single crystal composition.

One the word lines WL0 and WL1 have been formed, vertical cell diodes Dp may be respectively formed thereon. A vertical cell diode Dp may be selectively formed on a corresponding word line using a second mold layer 130. The second mold layer 130 may also be formed from a silicon oxide layer SiOx like the first mold layer 120. Alternately, the second mold layer 130 may be formed from a silicon nitride layer such as SiN and SiON.

The vertical cell diode Dp illustrated in FIG. 3 comprises a first semiconductor pattern 132 and a second semiconductor pattern 134. During write operations, directed to the unit cells Cp1-1 and Cp2-1, the corresponding vertical cell diode Dp allows write current to be passed from a bit lines BL0 and BL1 through the first electrode 142 to the second electrode 210. The first semiconductor pattern 132 and the second semiconductor pattern 134 are characterized by different conductivity types (P-type verse N-type). For example, the first semiconductor pattern 132 may be of first conductive type (e.g., N-type), and the second semiconductor pattern 134 may be of second conductive type (e.g., P-type).

The first semiconductor pattern 132 may have an impurity concentration less than that of the word lines WL0 and WL1. Also, the impurity concentration of the second semiconductor pattern 134 may be greater than that of the first semiconductor pattern 132. The first semiconductor pattern 132 and the second semiconductor pattern 134 may be epitaxially grown. Thus, assuming the material forming the word lines WL0 and WL1 is single crystal, the first and the second semiconductor patterns 132 and 134 may also be single crystal in composition.

The first electrode 142 is disposed on the vertical cell diode Dp using a third mold layer 140. The third mold layer 140 may be formed form a silicon oxide layer SiOx like the first mold layer 120. Alternatively, the third mold layer 140 may be formed from a silicon nitride layer such as SiN and SiON.

The first electrode 142 may be formed from one or more conductive materials, such as titanium nitride layer (TiN), a titanium aluminum nitride layer (TiAlN), a tantalum nitride layer (TaN), a tungsten nitride layer (WN), a molybdenum nitride layer (MoN), a niobium nitride layer (NbN), a titanium silicon nitride layer (TiSiN), a titanium boron nitride layer (TiBN), a zirconium silicon nitride layer (ZrSiN), a tungsten silicon nitride layer (WSiN), a tungsten boron nitride layer (WBN), a zirconium aluminum nitride layer (ZrAlN), a molybdenum aluminum nitride layer (MoAlN), a tantalum silicon nitride layer (TaSiN), a tantalum aluminum nitride layer (TaAlN), a titanium tungsten layer (TiW), a titanium aluminum layer (TiAl), a titanium oxynitride layer (TiON), a titanium aluminum oxynitride layer (TiAlON), a tungsten oxynitride layer (WON), and a tantalum oxynitride layer.

The first phase change material pattern 152 may now be disposed on the first electrode 142. The first phase change material pattern 152 may be formed from various materials, such as a compound composed of two elements including GaSb, InSb, InSe, SbTe, or GeTe, a compound composed of three elements including GeSbTe, GeBiTe, GaSeTe, InSbTe, SnSb$_2$Te$_4$, or InSbGe, or a compound composed of four elements including AgInSbTe, (GeSn)SbTe, GeSb(SeTe), or Te$_{81}$Ge$_{15}$Sb$_2$S$_2$. Also, to improve the semiconductor characteristics of first phase change material pattern, nitrogen (N), silicon (Si), carbon (C), or oxygen (O) can be doped with the material mentioned above. For example, GeSbTe doped with nitrogen (N), silicon (Si), carbon (C), or oxygen (O) can be used as the first phase change material pattern 152.

The first phase change material pattern 152 may be formed using a first interlayer dielectric layer 150. That is, the first phase change material pattern 152 may be disposed in a first via hole 151 selectively formed in the first interlayer dielectric layer 150. The formation of the first phase change material pattern 152 in the first interlayer dielectric layer 150 will be described hereafter in some additional detail.

When the first phase change material pattern 152 is formed in the first interlayer dielectric layer 150 its upper surface may be recessed (i.e., concaved or non-planar) relative to the surrounding first interlayer dielectric layer 150. Additionally, the mechanical strength of the first phase change material pattern 152 will be less than that of the surrounding first interlayer dielectric layer 150. In this context, the term "mechanical strength" is used to denote a particular material's relative reaction to applied tensile, compressive and/or shearing mechanical stresses. Thus, to say that the mechanical strength of the first phase change material pattern 152 will be less than that of the surrounding first interlayer dielectric layer 150 means the first phase change material pattern is more susceptible to mechanical deformation and/or damage that the first interlayer dielectric layer 150 relative to a similarly applied mechanical stress. Indeed, assuming that the first interlayer dielectric layer 150 is formed from a silicon oxide layer SiOx of a silicon nitride layer such as SiN and SiON, its mechanical strength will be very high.

The second electrode 210 may now be disposed on the first phase change material pattern 152. The second electrode 210 may be formed from the same material as first electrode 142, such as titanium (Ti) and/or titanium nitride (TiN).

Although not illustrated in FIG. 3, a bit line (not shown) may be formed on the second electrode 210. The bit line may be formed to cross over the word lines WL0 and WL1, and may be formed from aluminum (AL) or tungsten (W).

Referring collectively to FIGS. 3 through 13, a method of fabricating a phase change memory according to an embodiment of the inventive concept will be described, wherein FIGS. 4 through 13 are related sectional views illustrating processes included in the fabrication method.

Figure 4:
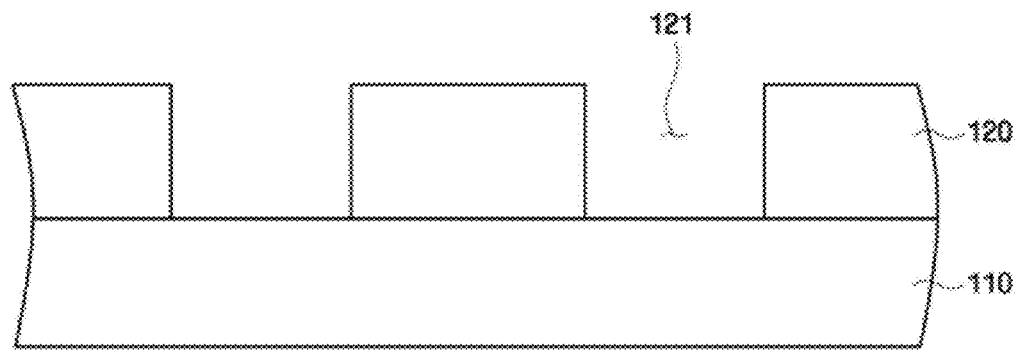
FIGS. 4 through 13 are related sectional views illustrating processes within the method of fabricating a phase-change semiconductor device according to an embodiment of the inventive concept.

Referring to FIG. 4, the first mold layer 120 is formed on substrate 110, and using a conventional photolithography process the first opening 121 is selectively formed therein. The first mold layer 120 may be formed (e.g.) of silicon oxide using Chemical Vapor Deposition (CVD) process.

Figure 5:
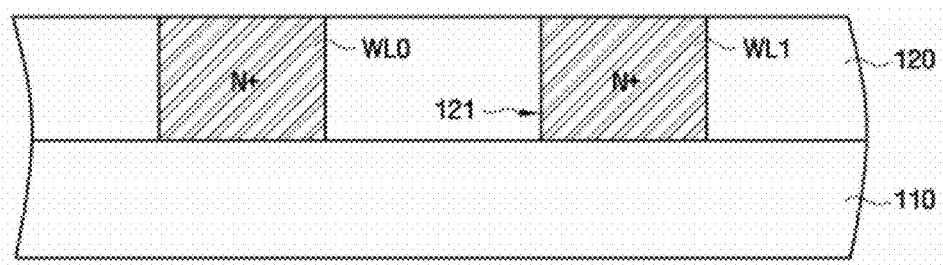

Next, referring to FIG. 5, word lines WL0 and WL1 are formed in the first opening 121. Specifically, by using the portions of the substrate 110 exposed through the first opening 121 as a seed layer, the word lines WL0 and WL1 may be formed using a Selective Epitaxial Growth (SEG) method. Assuming a single crystal substrate 110, the epitaxial layers formed by the SEG method will also be single crystal in composition. Other methods, such as Solid Phase Epitaxial (SPE) may be used to grow word lines WL0 and WL1. Following the formation of the conductive material forming the word lines WL0 and WL1, a planarization process may be used in conjunction with an upper surface of the first mold layer 120.

Figure 6:
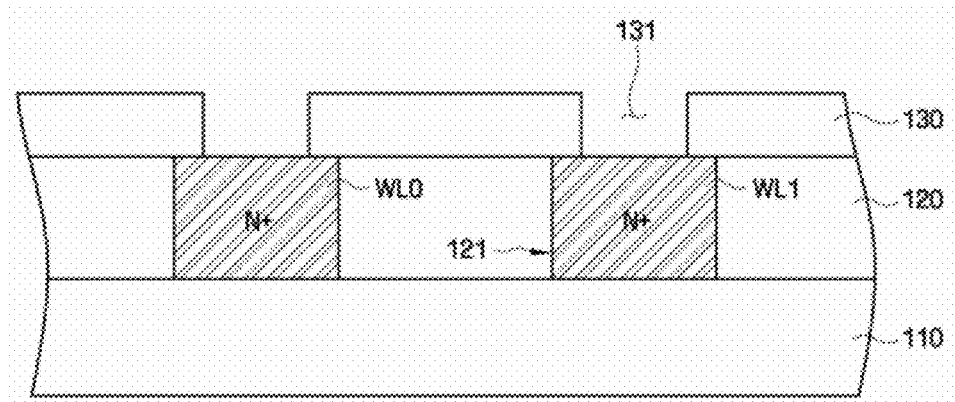

Next, referring to FIG. 6, the second mold layer 130 including a second opening 131 is formed on the resultant structure of FIG. 5. The second mold layer 130 may be formed like the first mold layer 120.

Figure 7:
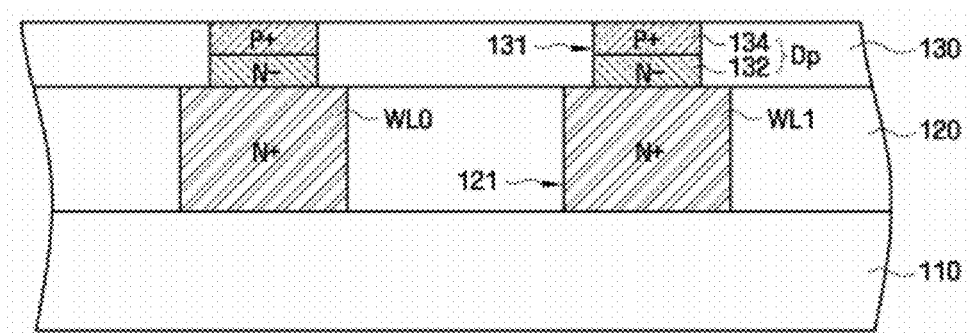

Next, referring to FIG. 7, the first and second semiconductor patterns 132 and 134 are formed in the second openings 131 of the resultant structure of FIG. 6 to form a vertical cell diode Dp. The first and second semiconductor patterns 132 and 134 may be formed using various methods including selective epitaxial growth, as above. Thus, assuming the word lines WL0 and WL1 are single crystal in composition and are used as seed layer, the first semiconductor pattern 132 and second semiconductor pattern 134 may also be single crystal in composition. Selective ion implantation may be used to define the conductivity type and impurity concentrations of the first semiconductor pattern 132 (e.g., N-type) and the second semiconductor pattern 134 (e.g., P-type). However, if impurities are doped in-situ during the selective epitaxial growth or solid phase epitaxial growth, ion implantation need not be separately performed.

Figure 8:
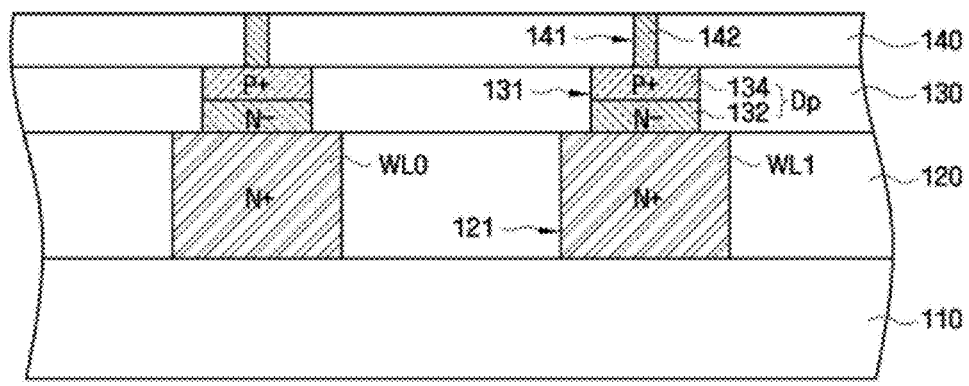

Next, referring to FIG. 8, the third mold layer 140 including a third opening 141 is formed on the resultant structure of FIG. 7. Portions of the second semiconductor pattern 134 are exposed through the third opening 141. Then, a conductive layer (not shown) may be deposited to fill the third opening 141. For example, one or more conductive layer(s) may be formed using methods including PVD (Physical Vapor Deposition), CVD (Chemical Vapor Deposition), and ALD (Atomic Layer Deposition). Then, an upper surface of the conductive layer(s) may be planarized using the upper surface of the third mold layer 140 to complete the formation of the first electrode 142.

Figure 9:
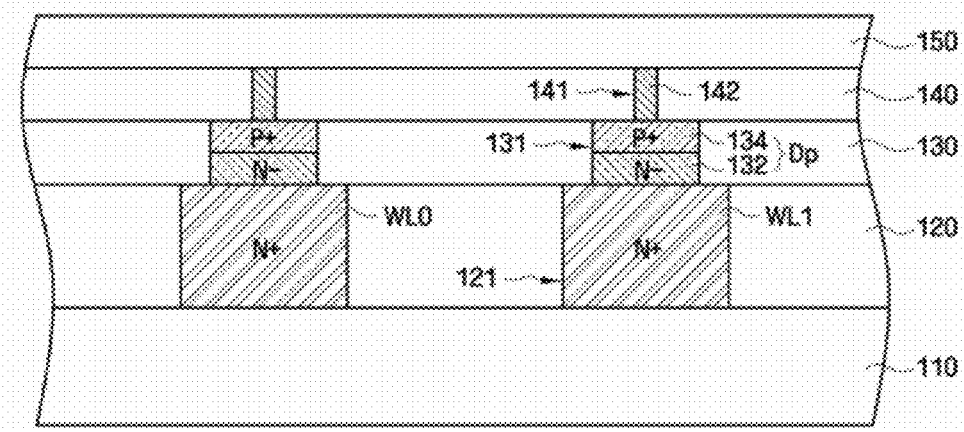

Next, referring to FIG. 9, a first interlayer dielectric layer 150 is formed on the resultant structure of FIG. 8. The first interlayer dielectric layer 150 may be formed the same method as the first mold layer 120.

Figure 10:
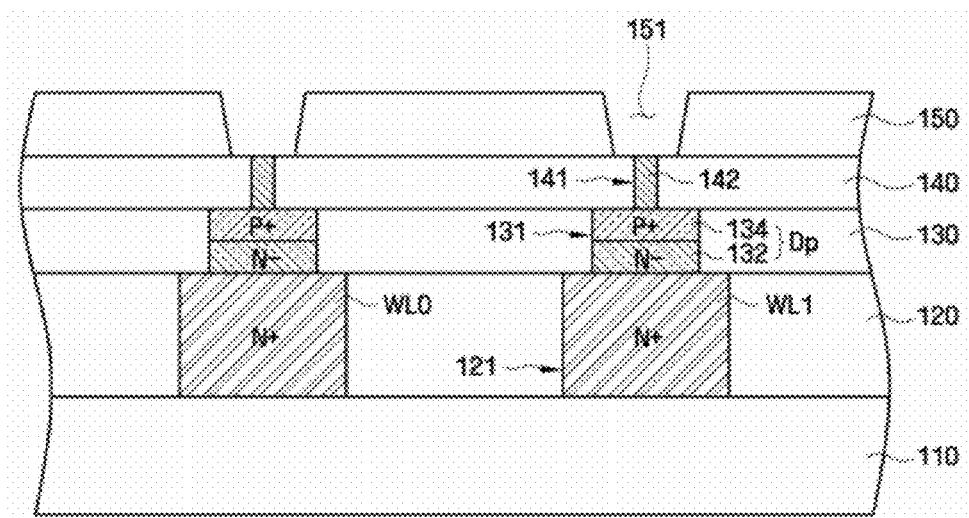

Next, referring to FIG. 10, a first via hole 151 is formed through the first interlayer dielectric layer 150 to expose the first electrode 142. The first via hole 151 may be formed using a conventional photoresist process.

Figure 11:
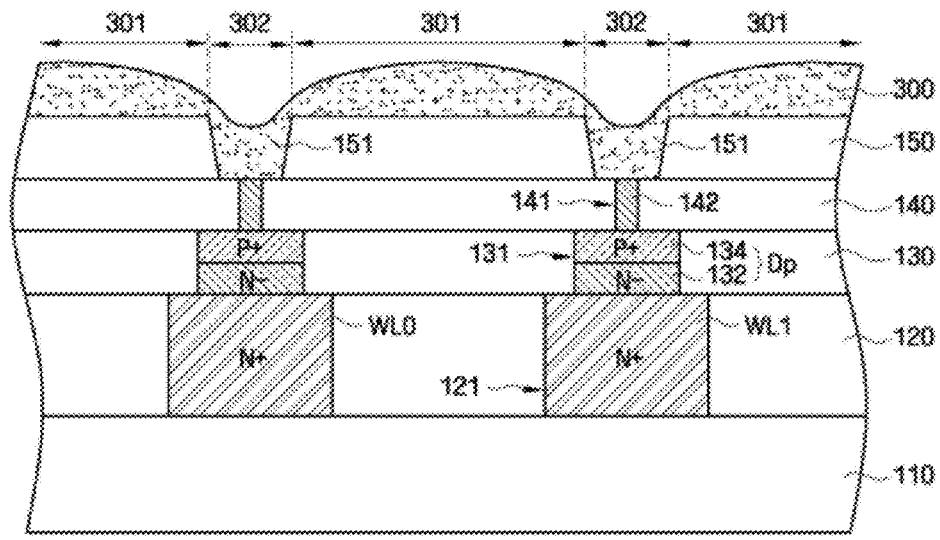

Next, referring to FIG. 11, a first phase change material layer 300 is formed on the first interlayer dielectric layer 150 to fill, at least partially, the first via hole 151. Here, the first phase change material layer 300 may be formed using CVD (Chemical Vapor Deposition), ALD (Atomic Layer Deposition), or PVD (Physical Vapor Deposition). The first phase change material layer may be formed from (e.g.) at least one of GeSbTe, C-doped GeSbTe, N-doped GeSbTe, etc.

The first phase change material layer 300 can include a first region 301 overlaying the planar surface of the first interlayer dielectric layer 150, and a second region 302 overlaying the first via hole 151 formed in the first interlayer dielectric layer 150. The upper surface is the first region 301 is higher than the upper surface of the second region 302. In this context, the term "higher" is a relative term denoting a separation distance between respective upper surfaces and some planar reference (e.g., the substrate 110).

Figure 12:
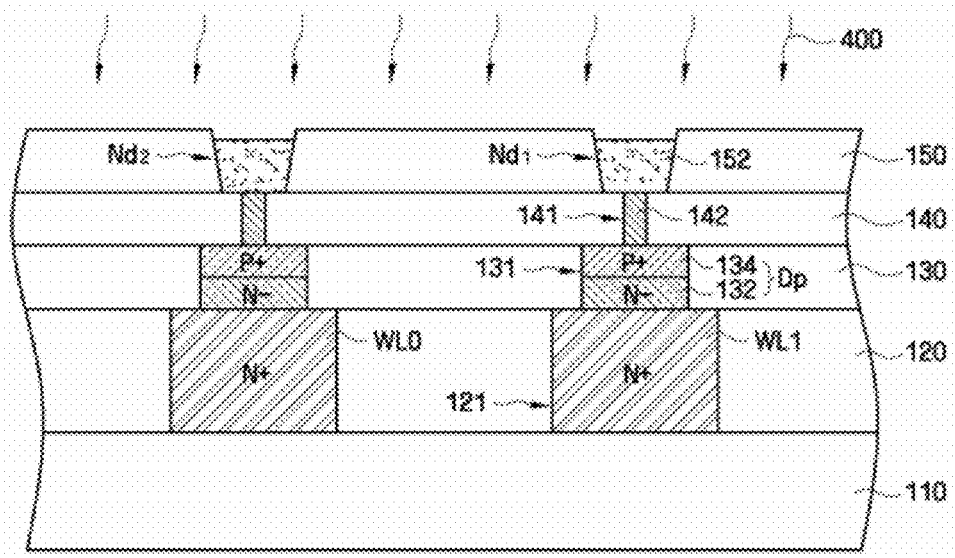

Next, referring to FIG. 12, an etch process is performed on the first phase change material layer 300. As a result, a first phase change material pattern 152 at least partially filling the first via hole 151 of the first interlayer dielectric layer 150 is formed. During the etch process, the first phase change material layer 300 is etched using a plasma 400 formed from at least one gas having a molecular weight of 17 or less (hereafter, the "plasma gas").

In order to etch the first phase change material layer 300, the plasma gas is injected into a process chamber (not shown) loaded with substrate 110 having the resultant structure shown in FIG. 11. The plasma gas should be chemically stable to avoid undesired side reactions, and have a molecular weight of 17 or less to minimize damage to the first interlayer dielectric layer 150 during the etch process applied to the first phase change material layer 300. Of note, the mechanical strength of the first phase change material layer 300 is less than that of the first interlayer dielectric layer 150. As a result, when using a plasma gas having relatively small molecular weight, the plasma gas may be safely used to etch only the first phase change material layer 300, as opposed to the first interlayer dielectric layer 150. As a result, the first interlayer dielectric layer 150 will not be significantly etched during the etching of the first phase change material layer 300, as may occur when the first phase change material layer 300 is etched using conventional CMP or dry etch processes.

The plasma gas may be at least one gas selected from a group consisting of helium (He), hydrogen ($H_2$), neon (Ne), and methane ($CH_4$). However, these are just noteworthy examples and other gases may be used, so long as the resulting plasma gas is chemically stable and has a molecular weight of 17 or less.

With the plasma gas introduced into the process chamber, a direct current (DC) or radio frequency (RF) power source is turned on to activate the plasma gas. By applying an electrical bias to the activated plasma gas, it may be accelerated towards the resultant structure of FIG. 11, and the first phase change material layer 300 will be etched. As noted above, the upper surface of the first region 301 of the first phase change material layer 300 is higher than the upper surface of the second region 302. Thus, the first region 301 will be etched more than the second region 302. Thus, relatively more of the first region 301 of the first phase change material layer 300 will be etched. As the first region 301 is etched a portion is not discharged and removed, but instead is stacked (or "restacked") on the second region 302. Thus, some portion of the phase change material etched from the first region 301 will additionally fill any unfilled portion of the first via hole 151. As a result, overall fill characteristics for the first phase change material layer 300 relative to the first via hole 151 are improved, and the likelihood of void formation in the first phase change material pattern 152 filling the first via hole 151 is reduced.

Process chamber pressure during the etch process of the first phase change material layer 300 may range between about 3 mTorr and 300 mTorr. When the chamber pressure during the etch process of the first phase change material layer 300 falls below 3 mTorr it has been determined that the "restacking effect" of the first phase change material layer 300 portion becomes too low under the impact of the accelerated plasma gas. When the process chamber pressure during the etch process of the first phase change material layer 300 exceeds 300 mTorr, it becomes difficult to activate the plasma gas, and the etch rate become too slow.

As noted above, the upper surface of the first phase change material pattern 152 formed by etching of the first phase change material layer 300 may be somewhat recessed below the upper surface of the first interlayer dielectric layer 150. The level of recess may be controlled by factors including etch process time for the first phase change material layer 300.

Of further note, the foregoing method effectively separates (and thereby electrically isolates) the respective portions of the first phase change material layer 300 forming first phase change material pattern nodes 152 associated with individual memory cell units Cp. Highly uniform first phase change material pattern nodes 152 may be provided by embodiments of the inventive concept without over etching of the first interlayer dielectric layer 150.

Figure 13:
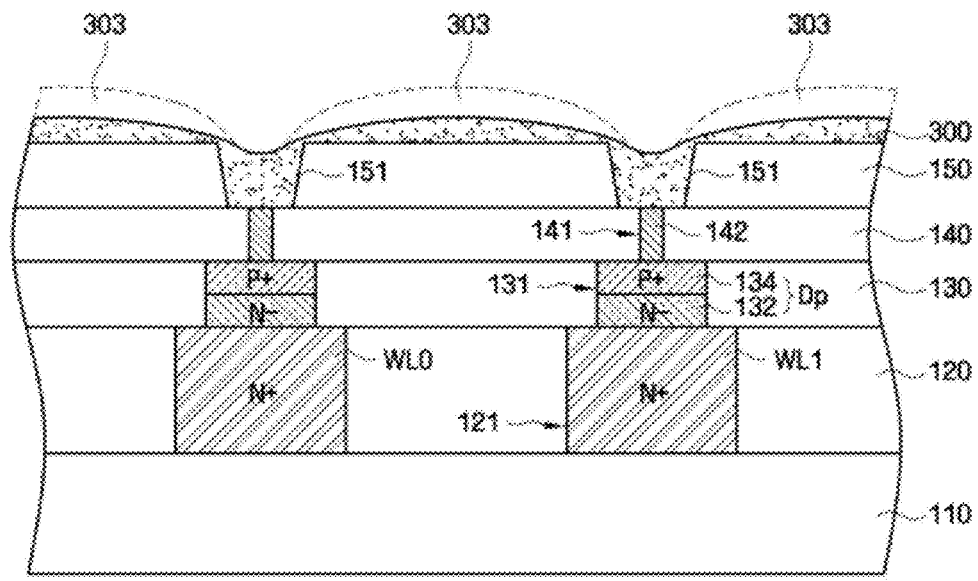

Referring to FIG. 13, before etching of the first phase change material layer 300 using the plasma gas 400, another etching process (e.g., a conventional CMP or dry etch process) may be applied to removes a first portion 303 of the first phase change material layer 300). As a result, the process time required to etch the first phase change material layer 300 using the plasma gas 400 may be markedly reduced. However, the CMP or dry etch process should only be performed until the first interlayer dielectric layer 150 begins to be exposed to avoid undesired etching of the first interlayer dielectric layer 150.

Another conductive layer (not shown) may now be formed on the resultant structure of FIG. 12. The conductive layer may be formed (e.g.) from one or more of titanium (Ti)/ titanium nitride (Ti/TiN) double layer using CVD (Chemical Vapor Deposition) or PVD (Physical Vapor Deposition). Later, by patterning the conductive layer a second electrode 210 may be formed as illustrated in FIG. 3.

Although not illustrated, on the second electrode 210 bit lines BL0 and BL1 can be formed to be crossed with the word lines WL0 and WL1.

Figure 14:
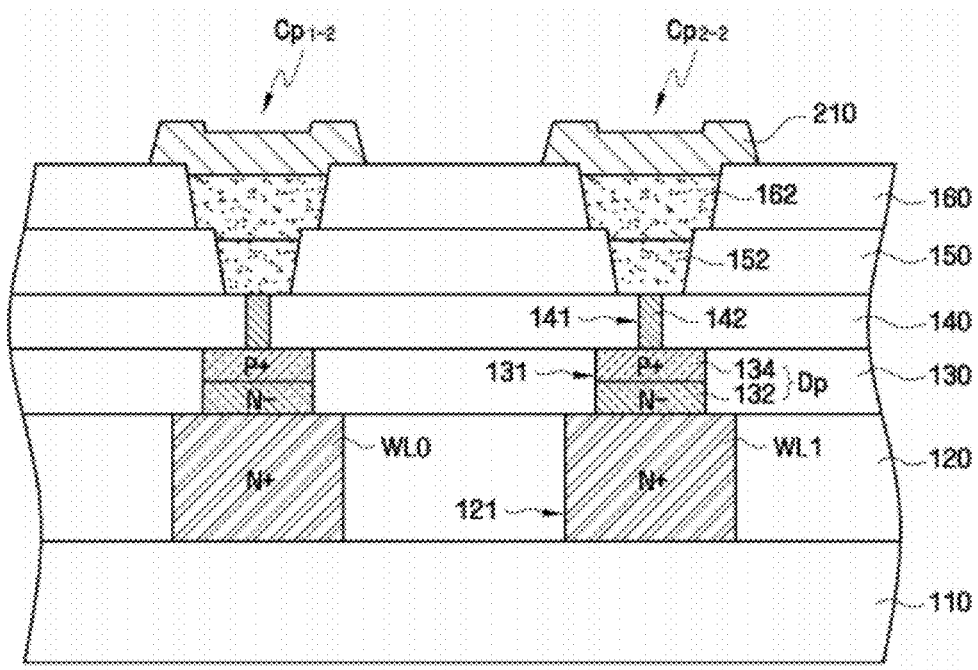
FIG. 14 is a sectional view illustrating a phase-change semiconductor device fabricated according to the embodiments of the inventive concept.
Figure 15:
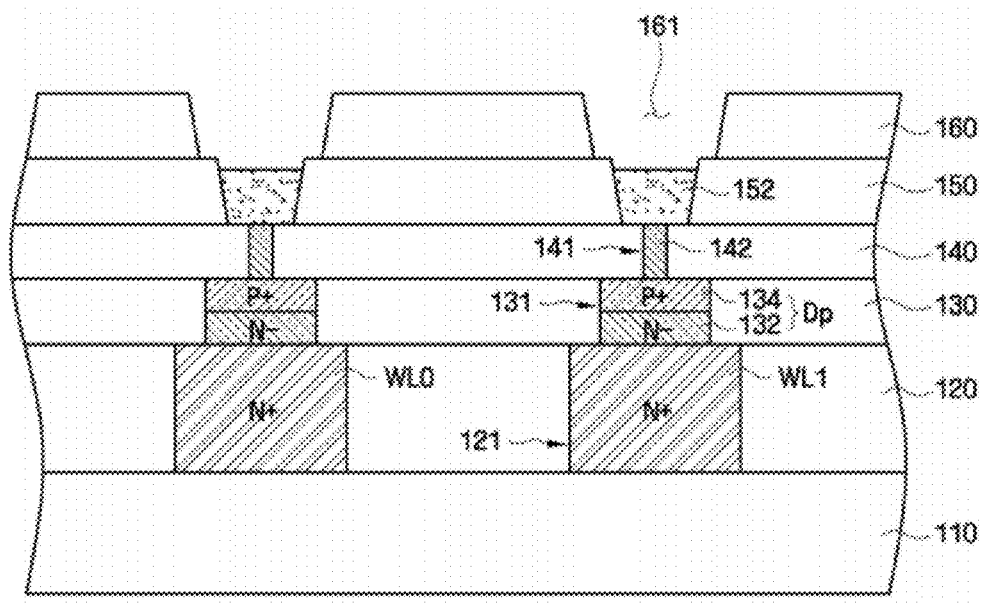
FIGS. 15 through 17 are related sectional views illustrating processes within the method of fabricating a phase-change semiconductor device according to an embodiment of the inventive concept.
Figure 16:
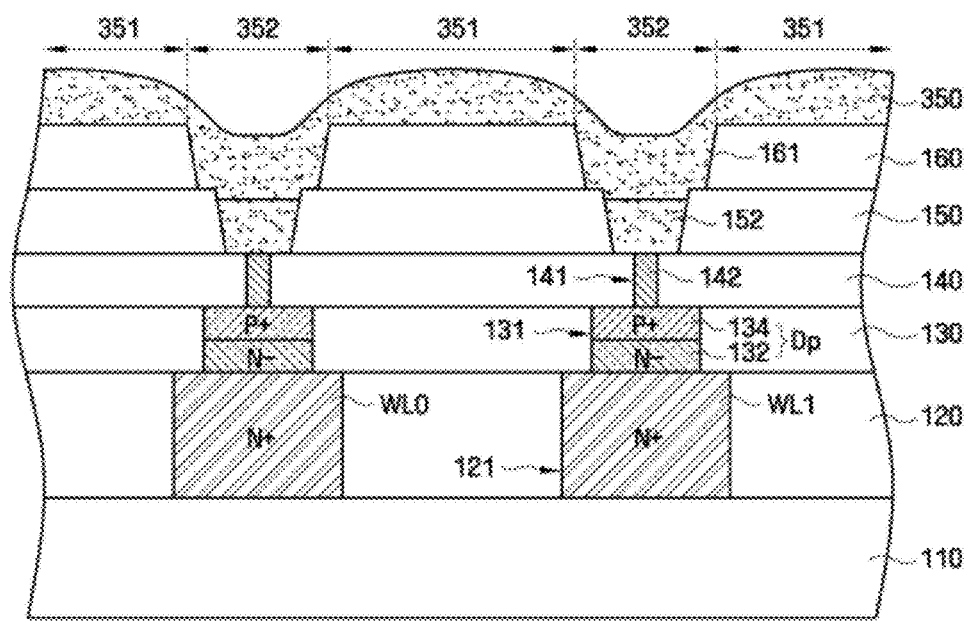
Figure 17:
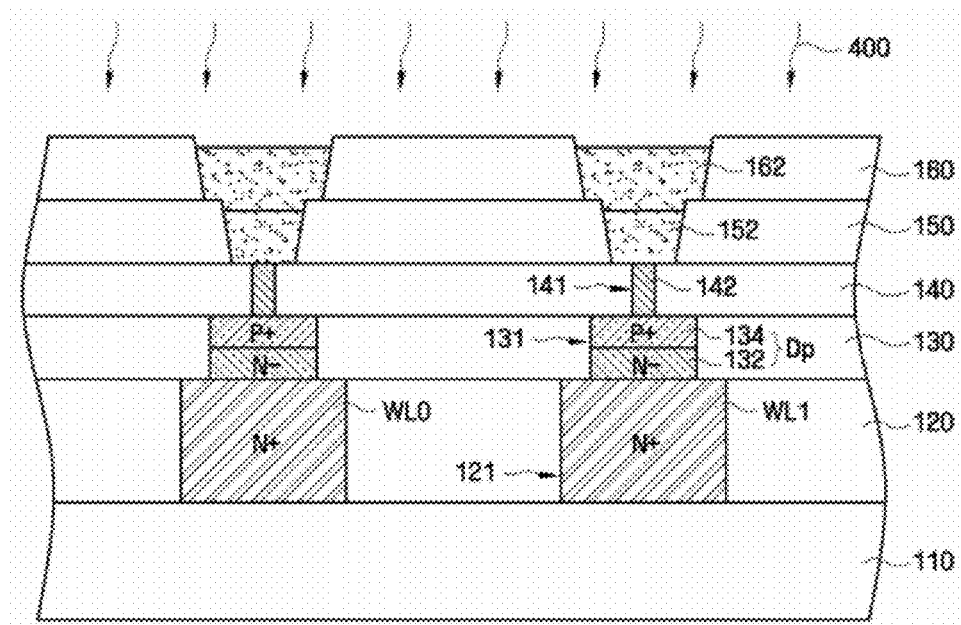

Referring now to FIGS. 14 through 17, a method of fabricating a phase change memory according to another embodiment of the inventive concept will be described. FIG. 14 is a sectional view of a phase change memory according to this embodiment, and FIGS. 15 through 17 are related sectional views illustrating process steps with the fabrication method. Process steps and resulting structures previously described will not be reiterated here.

Referring to FIG. 14, the phase change memory according to the illustrated embodiment of the inventive concept is largely identical to that previously described, except that the unit cells Cp1-2 and Cp2-2 are now assumed to be multi-level memory cells (MLC) capable of storing more than a single data bit value.

Since in the phase change memory of FIG. 14 includes unit cells Cp1-2 and Cp2-2 that are multi-level cells (MLC), a second interlayer dielectric layer 160 and a second phase change material pattern 162 are added to the resultant structure of FIG. 12. Here, the second phase change material pattern 162 may be formed from various materials such as a compound composed of two elements including GaSb, InSb, InSe, SbTe, or GeTe, a compound composed of three elements including GeSbTe, GeBiTe, GaSeTe, InSbTe, $SnSb_2Te_4$, or InSbGe or a compound composed of four elements including AgInSbTe, (GeSn)SbTe, GeSb(SeTe), $Te_{81}Ge_{15}Sb_2S_2$.

When programming the unit cells Cp1-2 and Cp2-2 to store data, a first phase change material pattern 152 can be composed of different material than the second phase change material pattern 162 to make resistance distribution created by the first phase change material pattern 152 and the second phase change material pattern 162 noticeable. For example, to make the resistance value of amorphous state of the second phase change material pattern 162 greater than that of amorphous state of the first phase change material pattern 152, the first phase change material pattern 152 and the second phase change material pattern 162 can be selected.

The second interlayer dielectric layer 160 may be formed from the same material as the first interlayer dielectric layer 150. Here, the mechanical strength of the second interlayer dielectric layer 160 will be greater than that of the second phase change material pattern 162.

Referring to FIG. 15, the second interlayer dielectric layer 160 is formed on the resultant structure of FIG. 12. The second interlayer dielectric layer 160 may be formed using the same method used to form the first mold layer 120. Then, a second via hole 161 exposing the first phase change material pattern 152 is formed through the second interlayer dielectric layer 160 using (e.g.,) photoresist process.

Next, referring to FIG. 16, a second phase change material layer 350 is formed on the second interlayer dielectric layer 160 to fill the second via hole 161. Here, the second phase change material layer 350 may be formed using CVD (Chemical Vapor Deposition), ALD (Atomic Layer Deposition), and PVD (Physical Vapor Deposition). The second phase change material layer 350 may be formed (e.g.,) from GeSbTe, C-doped GeSbTe, N-doped GeSbTe, etc. However, in certain embodiments of the inventive concept it is recommended to form the second phase change material layer 350 from a different material than the first phase change material layer 300.

Here, as before, the second phase change material layer 350 comprises a first region 351 overlaying the planar surface of the second interlayer dielectric layer 160, and a second region 352 overlaying the second via hole 161, wherein the first region has an upper surface higher than the upper surface of the region 352.

Referring to FIG. 17, an etch process is performed on the second phase change material layer 350 of the resultant structure of FIG. 16. As a result, the second phase change material pattern 162 is formed to fill the second via hole 161 in the second interlayer dielectric layer 160. In the etch process, the second phase change material layer 350 is etched using plasma gas 400 as before with similar effects.

A conductive layer (not shown) may now be formed on resultant structure of FIG. 17. The conductive layer may be formed from (e.g.) a double layer of titanium (Ti)/titanium nitride (Ti/TiN) using CVD (Chemical Vapor Deposition) or PVD (Physical Vapor Deposition). Then, by patterning the conductive layer a second electrode 210 is formed, as illustrated in FIG. 14.

Figure 18:
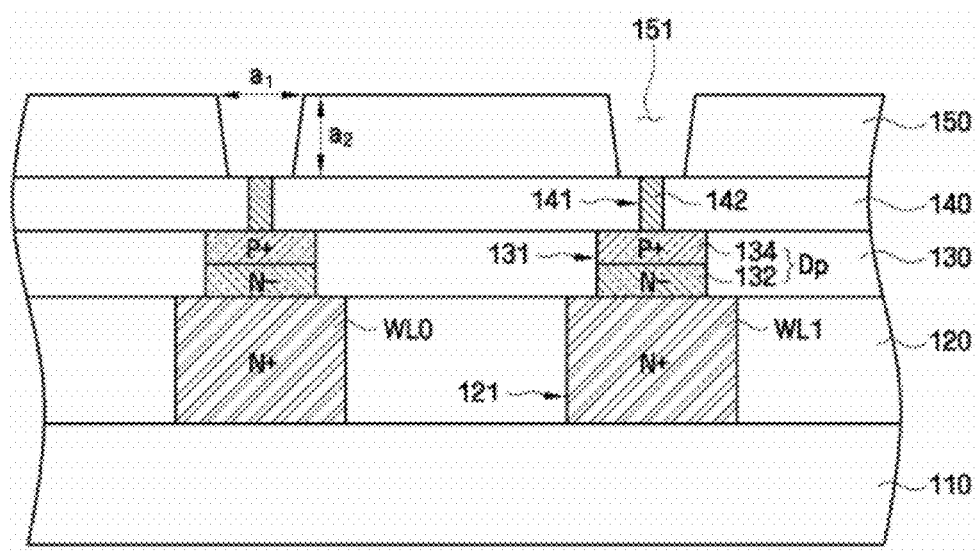
FIGS. 18 through 19D are related sectional views illustrating processes within the method of fabricating a phase-change semiconductor device according to another embodiment of the inventive concept.
Figure 19A:
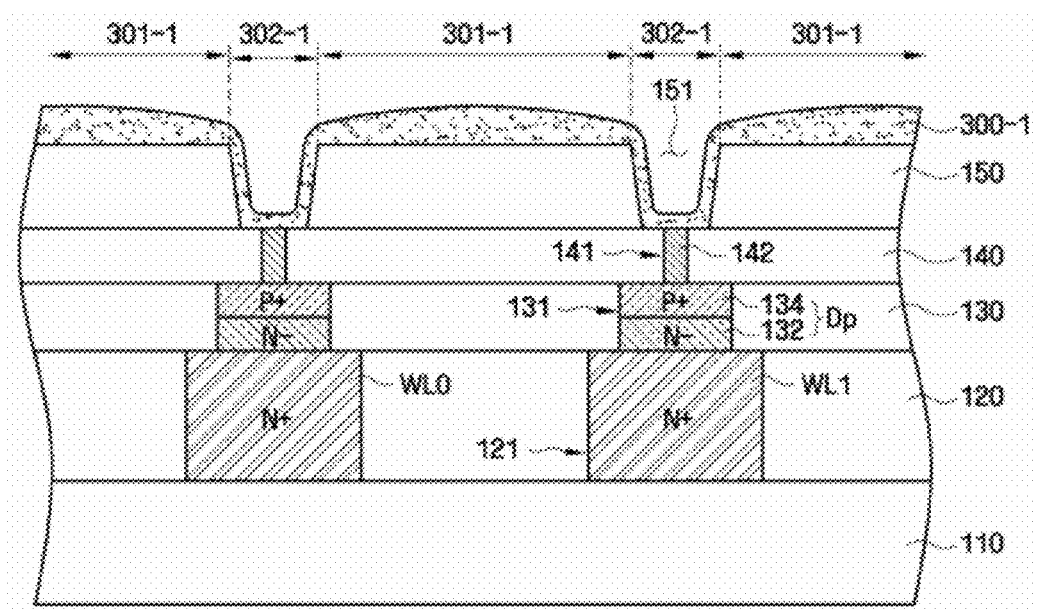
Figure 19B:
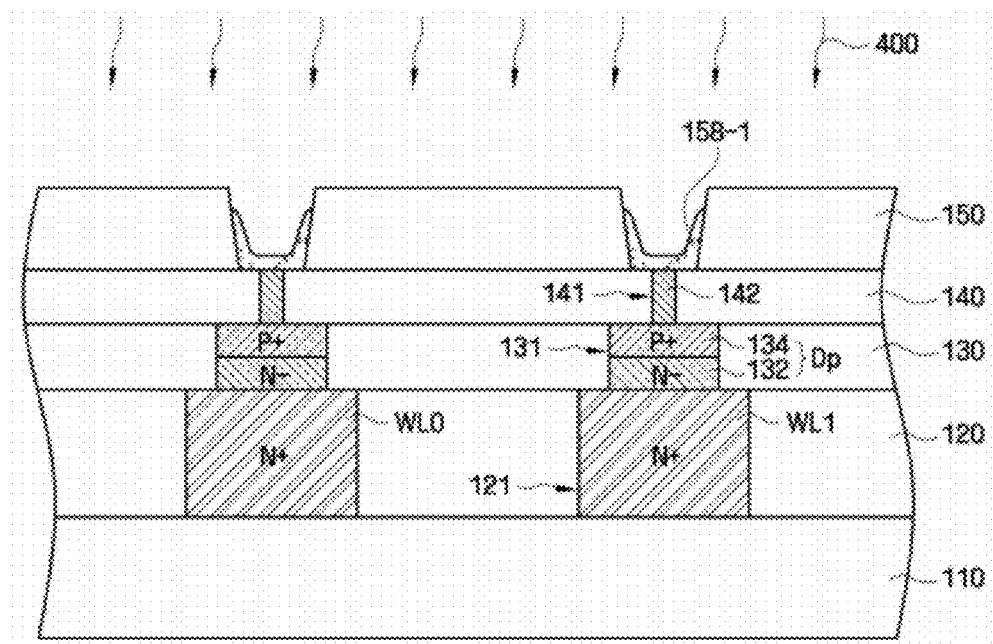
Figure 19C:
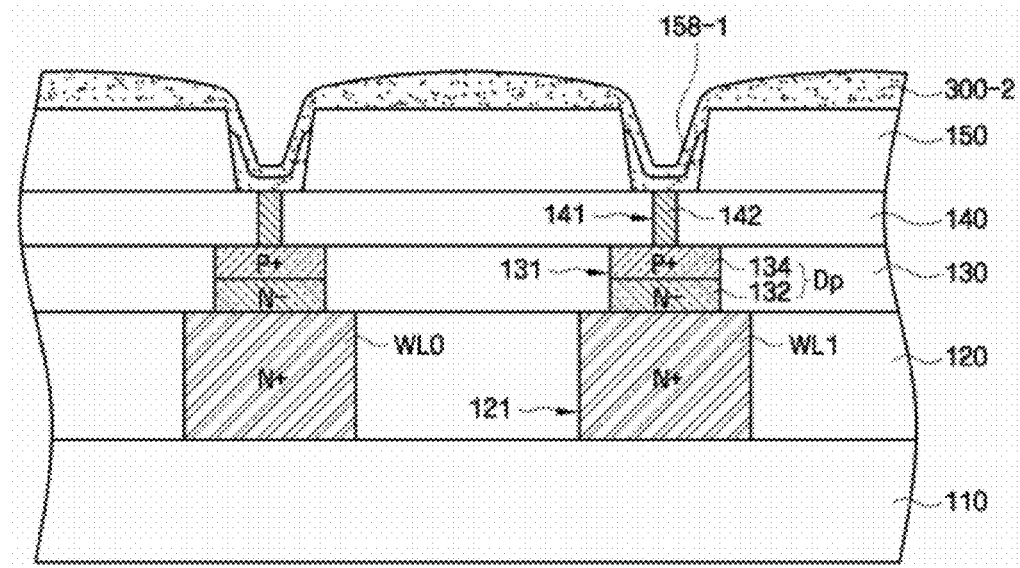
Figure 19D:
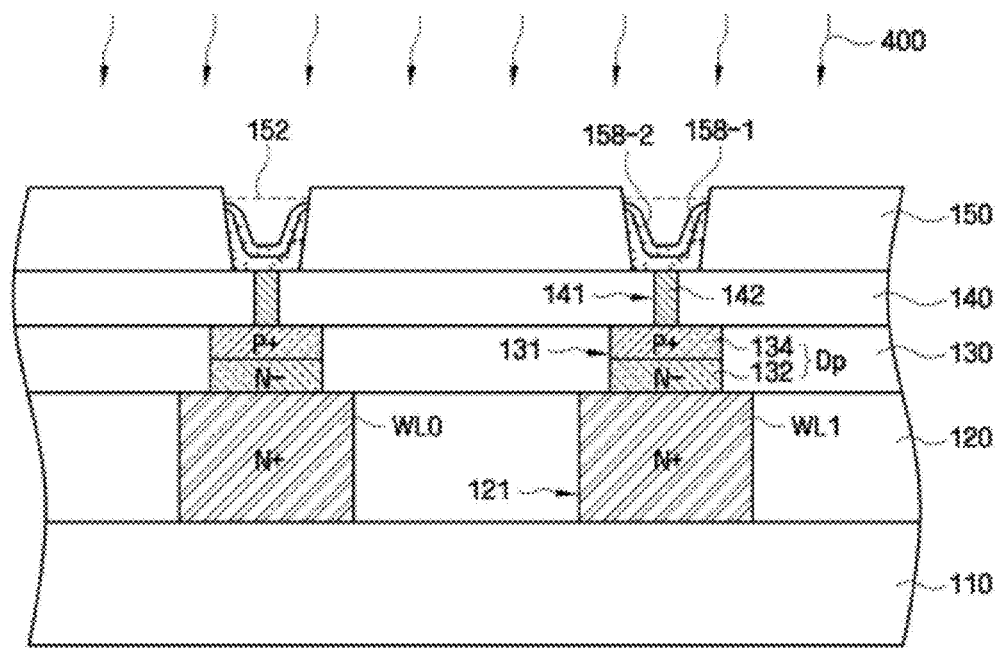

Referring now to FIGS. 3, 8, 12, and 18 through 19D, a method of fabricating a phase change memory according to another embodiment of the inventive concept will be described. FIGS. 18 through 19D are related sectional views illustrating process steps in the fabrication method. Only additions and changes to the previously described methods will be described here.

Referring to FIG. 18, the first interlayer dielectric layer 150 is formed on the resultant structure of FIG. 8, and the first via hole 151 is formed to expose the first electrode 142.

The first via hole 151 may be formed using photoresist process. However, the aspect ratio of the first via hole 151 in the subject embodiment may be greater than the previous embodiments. For example, the aspect ratio may be defined as a ratio between a width "a1" and height "a2" of the first via hole 151.

Next, referring to FIG. 19A, a first phase change material layer 300-1 is formed on the sidewall and bottom surface of the first via hole 151, and on the first interlayer dielectric layer 150 using (e.g.) CVD (Chemical Vapor Deposition), ALD (Atomic Layer Deposition), and PVD (Physical Vapor Deposition). The first phase change material layer 300-1 may be formed from GeSbTe, C-doped GeSbTe, N-doped GeSbTe, etc.

The first phase change material layer 300-1 again comprises a first region 301-1 overlaying the planar surface of the first interlayer dielectric layer 150 and a second region 302-1 overlaying the first via hole 151, wherein the same upper surface height difference (or corresponding thickness difference) is present.

Next, referring to FIG. 19B, an etch process is performed on the first phase change material layer 300-1 of the resultant structure of FIG. 19A. As a result, at least a portion of the sidewall surfaces and the bottom surface of the first via hole 151 are covered by the first phase change material pattern layer 158-1. During the etch process applied to the first phase change material layer 300-1, the same type of plasma gas 400 as previously described may be used with similar results.

Then, referring to FIGS. 19C and 19D, a second phase change material layer 300-2 may be formed and etched on the etched first phase change material layer 300-1 by repeating the foregoing steps. As a result, a second phase change material layer 158-2 may be formed in the first via hole 151.

In the method of fabrication illustrated by FIGS. 19A through 19D multiple phase change material pattern layers 158-1 and 158-2 may be formed from multiple phase change material layers 300-1 and 300-2 followed by etching to form a first phase change material pattern 152 in the first via hole 151. Thus, by repeating stacking the first phase change material layers 300-1 and 300-2 on the first interlayer dielectric layer 150 followed by etching the first phase change material pattern 152 in the first via hole 151 is formed. Therefore, a result like the one illustrated in FIG. 12 may be provided.

As an aspect ratio of the first via hole 151 formed in the first interlayer dielectric layer 150 increases, repetition of process to form the phase change material pattern layers 158-1 and 158-2 by forming the first phase change material layers 300-1 and 300-2 and etching the layer may be increased. Thus, as the aspect ratio of the first via hole 151 is increased, it becomes more difficult to form the first phase change material pattern 152 in the first via hole 151 without creating void. Therefore, as illustrated in the third exemplary embodiment, by performing the process repeatedly the first phase change material pattern 152 can be formed in the first via hole 151 without creating void even when the aspect ratio of first via hole 151 is increased.

The second electrode 210 may be similarly formed at this point.

Figure 20:
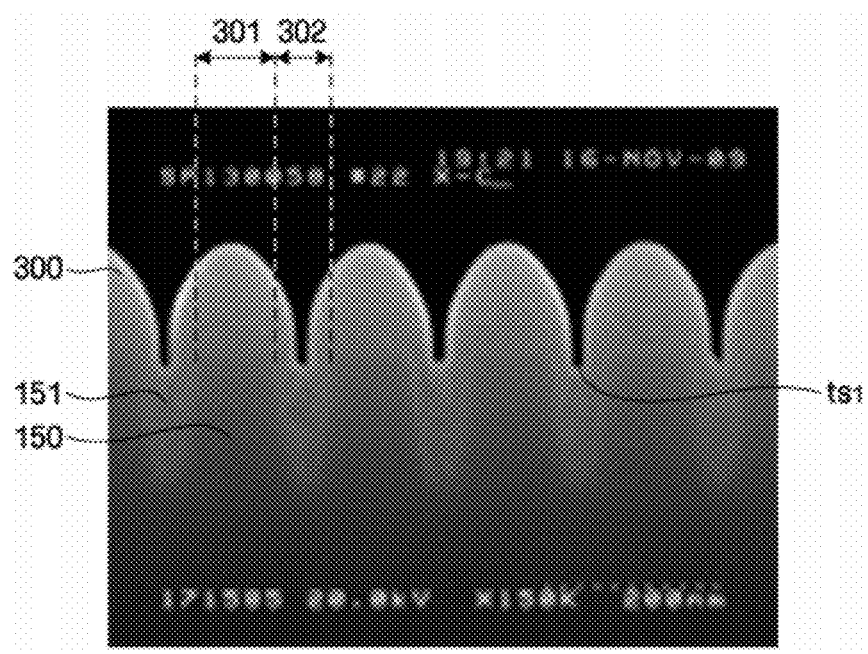
FIG. 20 is a photo of a first phase change material layer formed on a first interlayer dielectric layer according to one example of an embodiment of the inventive concept.
Figure 21:
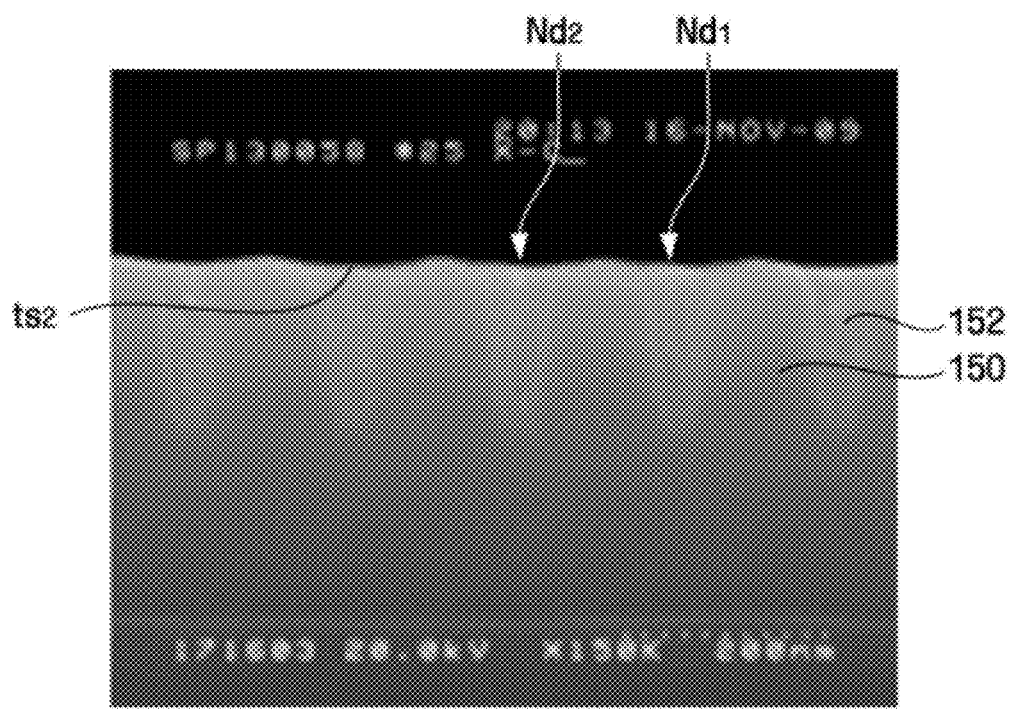
FIG. 21 is a photo showing the results of an etch process performed on the phase change material layer of a resultant structure of the example of FIG. 20.

FIGS. 20 and 21 are photos of an actual example of the foregoing embodiments of the inventive concept. FIG. 20 is a photo showing a first phase change material layer formed on a first interlayer dielectric layer. FIG. 21 is a photo showing after etch process on the first phase change material layer of a resultant structure of the FIG. 20 according to the present inventive concept.

Referring to FIG. 20, it was observed on a first interlayer dielectric layer 150 a first phase change material layer 300 was formed. Here, the first phase change material layer 300 included a first region 301 formed on a first interlayer dielectric layer 150 and a second region 302 formed on the first via hole 151. It was observed that the first region 301 was formed such that a top of the first region 301 was higher than a top of the second region 302.

Referring to FIG. 21, it was observed when etch process was performed on the first phase change layer 300 of the resultant structure of FIG. 20, the first region 301 of the first phase change material layer 300 was etched and a first phase change material pattern 152 was formed in the first via hole 151. Thus, during the etch process on the first phase change material layer 300 the first interlayer dielectric layer 150 was not etched.

Also, it was observed that as a result of etching the first phase change material layer 300 the first phase change material pattern 152 of a first node Nd1 and a second node Nd2 was formed separately.

Also, it is observed that the respective heights of the upper surfaces ts1 and ts2 of the second region 302 of the first phase change material layer 300 changed due to the etch process applied to the first phase change material layer 300. Thus, compared to the upper surface ts1 of the second region 302 of FIG. 20, the height of the upper surface ts2 of the second region 302 of FIG. 21 was higher. This is because when the first phase change material 300 is etched, a portion of the etched phase change material is restacked on the second region 302. As a result, the first phase change material pattern 152 was formed in the first via hole 151 without creating a void.

While the present inventive concept has been particularly shown and described with reference to exemplary embodiments thereof, it will be understood by those of ordinary skill in the art that various changes in form and detail may be made therein without departing from the scope of the inventive concept as defined by the following claims. The exemplary embodiments should be considered in a descriptive sense only and not for purposes of limitation.

What is claimed is:

1. A method of fabricating a phase change semiconductor memory device, the method comprising:

forming a first electrode in an insulation layer formed on a semiconductor substrate;

forming a first interlayer dielectric layer on the insulation layer including the first electrode;

forming a first via hole through the first interlayer dielectric layer to expose the first electrode;

forming a first phase change material layer on the first interlayer dielectric layer to at least partially fill the first via hole;

etching the first phase change material layer using a plasma formed from a plasma gas having a molecular weight of 17 or less to form a first phase change material pattern in the first via hole; and before etching the first phase change material layer using the plasma, etching the first phase change material layer using a dry etching process or a chemical mechanical polishing (CMP) process to remove a portion of the first phase change material layer outside of the first via hole.

2. The method of claim 1, wherein the plasma gas comprises at least one gas selected from a group consisting of helium (He), hydrogen ($H_2$), neon (Ne), and methane ($CH_4$).

3. The method of claim 1, wherein the first phase change material pattern has an upper surface recessed in relation to an upper surface of the first interlayer dielectric layer.

4. The method of claim 1, wherein the first phase change material layer comprises a first region overlaying a planar surface of the first interlayer dielectric layer, and a second region overlaying the first via hole, wherein an upper surface of the first region is higher than an upper surface of the second region.

5. The method of claim 4, wherein etching the first phase change material layer completely removes the first region.

6. The method of claim 5, wherein during the etching of the first phase change material, a portion of the first phase change material completely removed from the first region is restacked on the second region.

7. The method of claim 1, wherein etching the first phase change material layer is performed at a pressure that ranges between about 3 mTorr to about 300 mTorr.

8. The method of claim 1, wherein a mechanical strength of the first interlayer dielectric layer is greater than a mechanical strength of the first phase change material layer.

9. The method of claim 1, further comprising:
after the first phase change material pattern is formed, forming a second interlayer dielectric layer on the first interlayer dielectric layer;

forming a second via hole in the second interlayer dielectric layer to expose the first phase change material pattern;

forming a second phase change material layer on the second interlayer dielectric layer to at least partially fill and the second via hole; and etching the second phase change material layer using a plasma formed from the plasma gas to form a second phase change material pattern in the second via hole.

10. The method of claim 1, wherein etching the first phase change material layer using a dry etching process or a CMP process removes the portion of the first phase change material layer entirely on the top surface of the insulation layer.

11. A method of fabricating a phase change semiconductor memory device, the method comprising:
forming a first mold layer on a semiconductor substrate, forming a first opening in the first mold layer, and forming a word line in the first opening;

forming a second mold layer on the first mold layer, forming a second opening in the second mold layer to expose the word line, and forming a vertical cell diode in the second opening;

forming a third mold layer on the second mold layer, forming a third opening in the third mold layer to expose the vertical cell diode, and forming a first electrode in the third opening;

forming a first interlayer dielectric layer on the third mold including the first electrode;

forming a first via hole through the first interlayer dielectric layer to expose the first electrode;

forming a first phase change material layer on the first interlayer dielectric layer to at least partially fill the first via hole; and etching the first phase change material layer using a plasma formed from a plasma gas having a molecular weight of 17 or less to form a first phase change material pattern in the first via hole.

12. The method of claim 11, wherein the plasma gas comprises at least one gas selected from a group consisting of helium (He), hydrogen ($H_2$), neon (Ne), and methane ($CH_4$), and
etching the first phase change material layer is performed at a pressure that ranges between about 3 mTorr to about 300 mTorr.

13. The method of claim 11, wherein the first phase change material layer comprises a first region overlaying a planar surface of the first interlayer dielectric layer, and a second region overlaying the first via hole, wherein an upper surface of the first region is higher than an upper surface of the second region,
etching the first phase change material layer completely removes the first region, and
during the etching of the first phase change material, a portion of the first region first phase change material completely removed from the first region is restacked on the second region.

14. The method of claim 11, wherein the first interlayer dielectric layer is formed from a silicon oxide or a silicon nitride and has a mechanical strength greater than a mechanical strength of the first phase change material layer.

15. The method of claim 11, further comprising:
before etching the first phase change material layer using the plasma, using a chemical mechanical process (CMP) to remove a portion of the first phase change material layer.

16. The method of claim 11, further comprising:
before etching the first phase change material layer using the plasma, using dry etching process to remove a portion of the first phase change material layer.

17. The method of claim 11, further comprising:
after the first phase change material pattern is formed, forming a second interlayer dielectric layer on the first interlayer dielectric layer;

forming a second via hole in the second interlayer dielectric layer to expose the first phase change material pattern;

forming a second phase change material layer on the second interlayer dielectric layer to at least partially fill and the second via hole; and etching the second phase change material layer using a plasma formed from the plasma gas to form a second phase change material pattern in the second via hole.

18. A method of fabricating a phase change semiconductor memory, the method comprising:
forming a plurality of unit memory cells, each one comprising a phase change element connected to a corresponding vertical cell diode, wherein the phase change element is formed from at least one phase change material layer formed on an interlayer dielectric layer including a via hole, the at least one phase change material layer being etched using a dry etching process or a chemical mechanical polishing (CMP) process and thereafter etched using a plasma formed from a plasma gas having a molecular weight of 17 or less to form a respective phase change material pattern in the via hole.

19. The method of claim 18, wherein the at least one phase change material layer comprises a plurality of phase change material layers etched to form respective phase change material patterns in the via hole.

* * * * *